(12) United States Patent
Kawamura et al.

(10) Patent No.: US 11,974,454 B2
(45) Date of Patent: Apr. 30, 2024

(54) DISPLAY DEVICE AND METHOD FOR MANUFACTURING DISPLAY DEVICE

(71) Applicant: SHARP KABUSHIKI KAISHA, Sakai (JP)

(72) Inventors: Hiroki Kawamura, Sakai (JP); Keiji Aota, Sakai (JP); Motoji Shiota, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 454 days.

(21) Appl. No.: 17/437,339

(22) PCT Filed: Mar. 11, 2019

(86) PCT No.: PCT/JP2019/009804
§ 371 (c)(1),
(2) Date: Sep. 8, 2021

(87) PCT Pub. No.: WO2020/183589
PCT Pub. Date: Sep. 17, 2020

(65) Prior Publication Data
US 2022/0181581 A1    Jun. 9, 2022

(51) Int. Cl.
*H01L 51/56*    (2006.01)
*H01L 21/32*    (2006.01)
*H01L 51/00*    (2006.01)
*H10K 50/844*   (2023.01)
*H10K 59/12*    (2023.01)
*H10K 71/00*    (2023.01)
*H10K 71/80*    (2023.01)
*H10K 77/10*    (2023.01)
*H10K 102/00*   (2023.01)

(52) U.S. Cl.
CPC .......... *H10K 50/844* (2023.02); *H10K 59/12* (2023.02); *H10K 71/00* (2023.02); *H10K 71/80* (2023.02); *H10K 77/111* (2023.02); *H10K 59/1201* (2023.02); *H10K 2102/311* (2023.02)

(58) Field of Classification Search
CPC .......................... H10K 59/131; H10K 77/111
See application file for complete search history.

(56) References Cited

U.S. PATENT DOCUMENTS

| | | |
|---|---|---|
| 2017/0288005 A1 | 10/2017 | Kawata |
| 2018/0182829 A1 | 6/2018 | Shin et al. |
| 2018/0212169 A1 | 7/2018 | Goto |
| 2019/0333981 A1 | 10/2019 | Kawata |
| 2020/0176549 A1 | 6/2020 | Kawata |
| 2021/0091166 A1 | 3/2021 | Kawata |

FOREIGN PATENT DOCUMENTS

| | | |
|---|---|---|
| JP | 2016224118 A | 12/2016 |
| JP | 2017187580 A | 10/2017 |
| JP | 2018120087 A | 8/2018 |

*Primary Examiner* — John A Bodnar
(74) *Attorney, Agent, or Firm* — ScienBiziP, P.C.

(57) ABSTRACT

A display device is provided with a first adhesive layer formed on a sealing layer in a display region and a flexible sheet formed on a resin layer on an opposite side of a TFT layer, in which a first inorganic insulating layer has a first slit, the flexible sheet has a second slit, and the first adhesive layer is formed in a state of extending from the display region to a frame region, and overlapping with the first slit and the second slit.

7 Claims, 18 Drawing Sheets

A-A CROSS-SECTIONAL VIEW

DISPLAY DEVICE AND METHOD FOR MANUFACTURING DISPLAY DEVICE

TECHNICAL FIELD

The disclosure relates to a display device having a display region for displaying an image and a frame region surrounding the display region in which the frame region includes a terminal region arranged at an edge of the frame region and a bending region bent into a substantially J shape between the display region and the terminal region, and a method for manufacturing the display device.

BACKGROUND ART

Hitherto, in a display device having a display region for displaying an image and a frame region surrounding the display region in which the frame region includes a terminal region arranged at an edge of the frame region, a configuration is known in which a bending region bent into a substantially J shape is provided between the display region and the terminal region for the purpose of narrowing the frame region. Then, in order to protect the bending region from stress after bending, resin is applied to a portion corresponding to the outer periphery of the bending region.

In addition, a configuration is known in which a protection layer that protects a display portion provided in a display region is provided from the display region to the bending region (PTL 1).

CITATION LIST

Patent Literature

PTL 1: JP 2018-120087 A (published on Aug. 2, 2018)

SUMMARY

Technical Problem

However, in the configuration in which resin is applied to the portion corresponding to the outer periphery of the bending region, it is a problem to secure the region to which the resin is applied in the bending region. In addition, in order to bend the bending region for the purpose of narrowing the frame region of the display device, it is a problem to add a step of applying the resin separately.

An object of one aspect of the disclosure is to provide a display device having a frame region narrowed by bending in a simple configuration and a simple process.

Solution to Problem

A display device according to the disclosure has a display region configured to display an image and a frame region surrounding the display region, in which the frame region includes a terminal region arranged at an edge of the frame region and a bending region bent between the display region and the terminal region. The display device includes a substrate arranged in the display region and the frame region, a TFT layer formed on the substrate, a light-emitting element layer formed on the TFT layer in the display region, a sealing layer formed in the display region in a state of covering the light-emitting element layer, an adhesive layer formed on the sealing layer in the display region, a function layer formed on the adhesive layer in the display region, and a flexible sheet formed on the substrate on an opposite side of the TFT layer, in which the TFT layer includes at least one inorganic insulating film, the inorganic insulating film has a first slit extending in the bending region along the edge of the frame region, the flexible sheet has a second slit extending in the bending region along the edge of the frame region. The display device further includes a filler resin layer that fills the first slit, in which the adhesive layer overlaps with the first slit and the second slit by extending from the display region to the frame region.

In a method for manufacturing the display device according to the disclosure, the display device has the display region configured to display an image and the frame region surrounding the display region, in which the frame region includes the terminal region arranged at an edge of the frame region and the bending region bent between the display region and the terminal region. The method includes forming a TFT layer on a substrate arranged in the display region and the frame region, forming a light-emitting element layer on the TFT layer in the display region, forming a sealing layer in the display region in a state of covering the light-emitting element layer, bonding a first film to the sealing layer, peeling off the substrate from the TFT layer, bonding a flexible sheet to the TFT layer on an opposite side of the light-emitting element layer, peeling off the first film on the sealing layer, bonding a second film in which an adhesive layer and a separator are layered on the sealing layer formed in the display region and the TFT layer formed in the display region and the frame region, peeling off the separator overlapping with at least the display region from the adhesive layer, bonding a function layer to the display region via the adhesive layer, bending the flexible sheet, the TFT layer, and the adhesive layer between the display region and the terminal region in the bending region, and curing the adhesive layer by irradiating the adhesive layer in the bending region with ultraviolet rays.

Advantageous Effects of Disclosure

According to one aspect of the disclosure, the display device can have a frame region narrowed by bending in a simple configuration and a simple process.

DESCRIPTION OF EMBODIMENTS

First Embodiment

Configuration of Display Device 1

Figure 1:
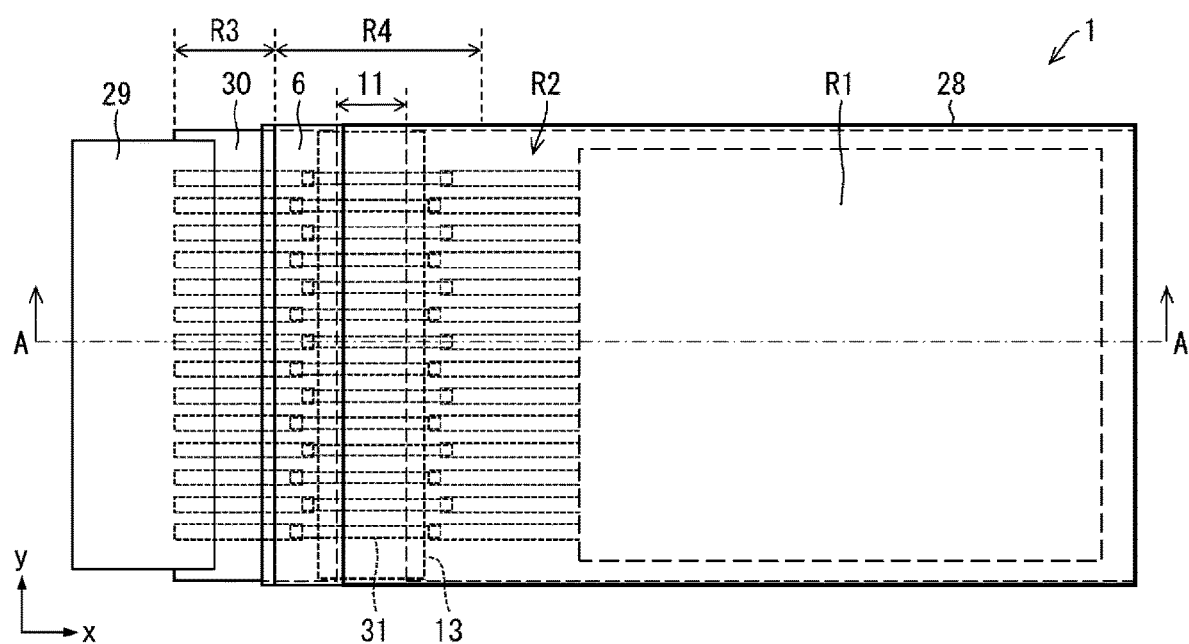
FIG. 1 is a plan view of a display device according to a first embodiment before bending.
Figure 2:
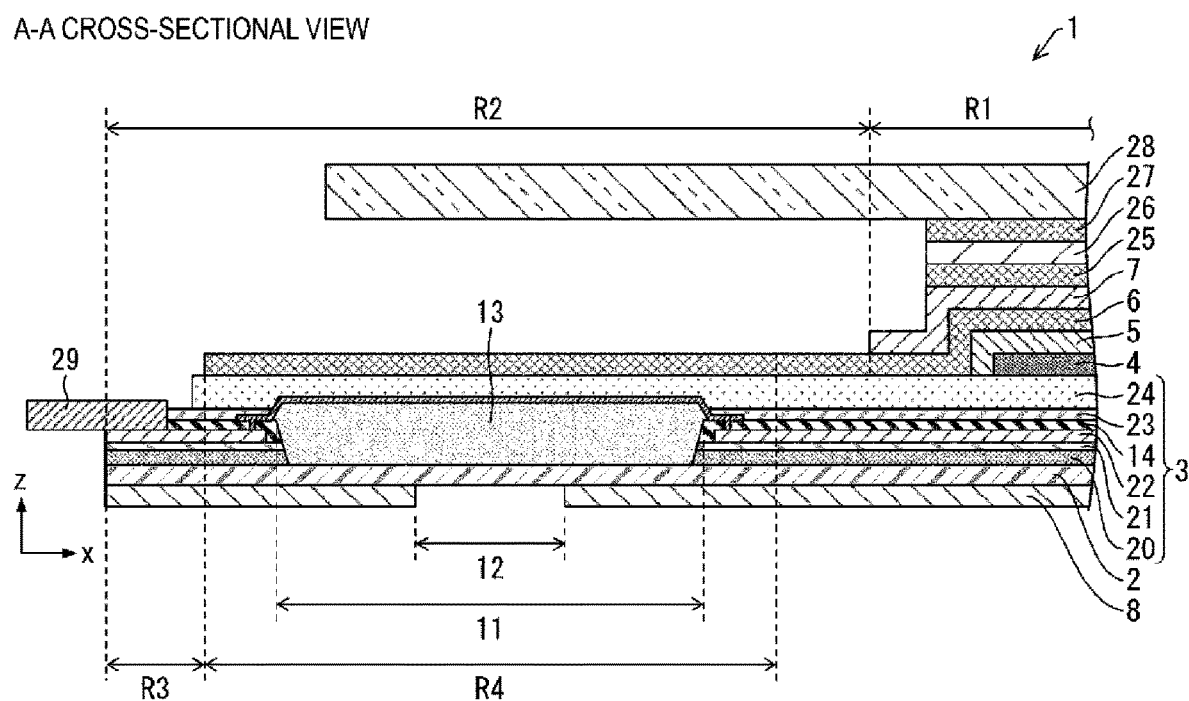
FIG. 2 is a cross-sectional view of the display device.
Figure 3:
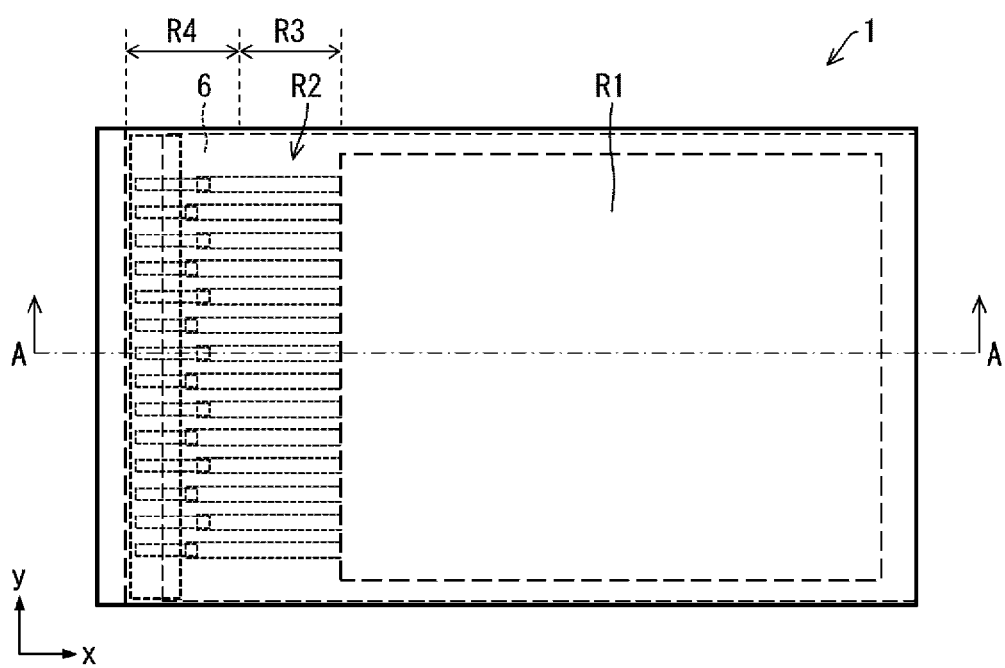
FIG. 3 is a plan view of the display device after bending.
Figure 4:
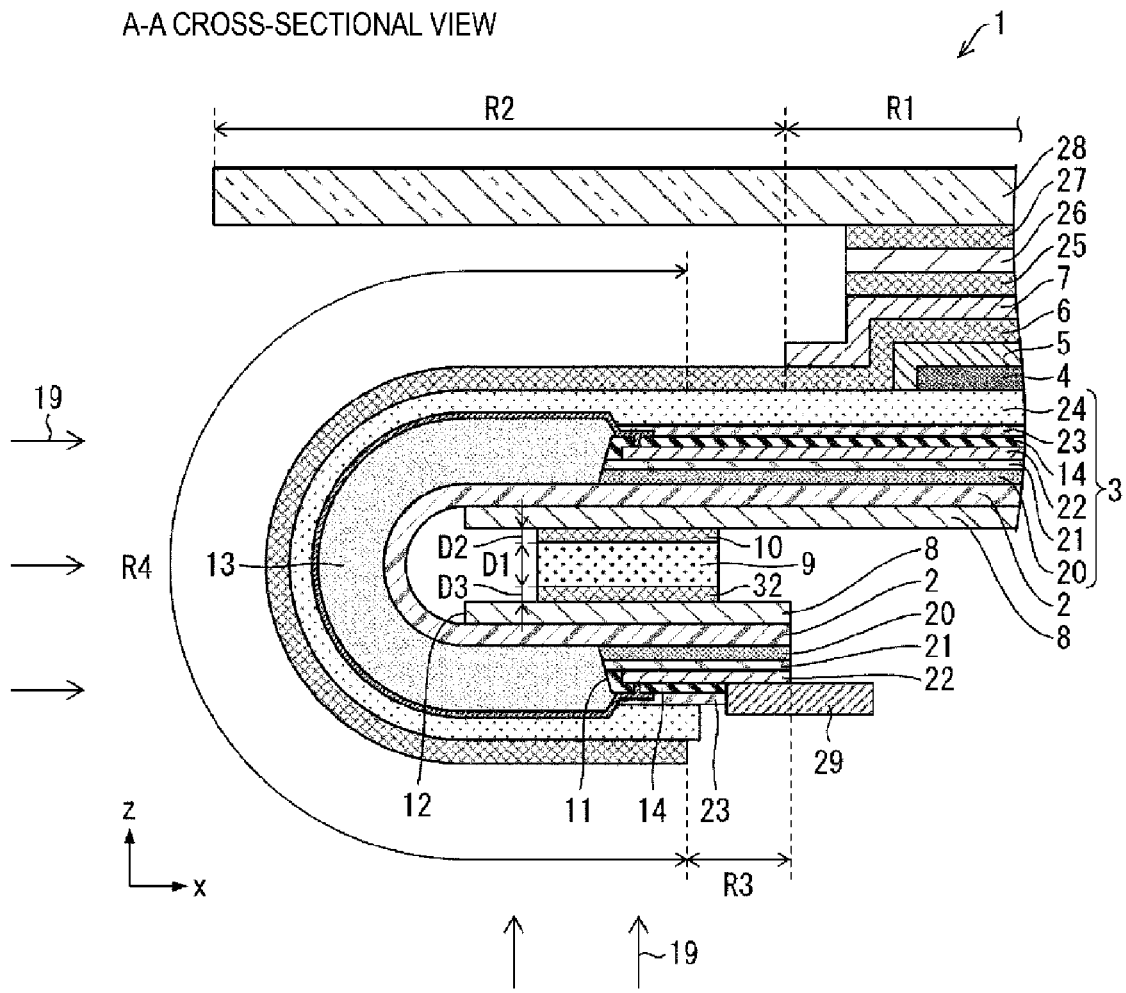
FIG. 4 is a cross-sectional view of the display device after bending.

FIG. 1 is a plan view of a display device 1 according to a first embodiment before bending, and FIG. 2 is a cross-sectional view thereof. FIG. 3 is a plan view of the display device 1 after bending, and FIG. 4 is a cross-sectional view thereof.

The display device 1 has a display region R1 for displaying an image and a frame region R2 surrounding the display region R1. The frame region R2 includes a terminal region R3 arranged at an edge of the frame region R2, and a bending region R4 bent into a substantially J shape between the display region R1 and the terminal region R3. A wiring line substrate (Chip On Film (COF)) 29 is connected in the terminal region R3.

The display device 1 includes a resin layer 2 (substrate) arranged over the display region R1 and the frame region R2, a TFT layer (thin film transistor layer) 3 formed on the resin layer 2, a light-emitting element layer 4 formed on the TFT layer 3 in the display region R1, a sealing layer 5 formed in the display region R1 in a state of covering the light-emitting element layer 4, a first adhesive layer 6 (adhesive layer) formed on the sealing layer 5 in the display region R1, a function layer 7 formed on the first adhesive layer (Optical Clear Adhesive (OCA)) 6 in the display region R1, and a flexible sheet 8 formed on the resin layer 2 on an opposite side of the TFT layer 3. The function layer 7 includes a touch panel, an antireflection layer (a layered film of a ¼λ plate and a linear polarizer), and the like. The flexible sheet 8 can be made of a lamination film. The resin layer 2 can be made of, for example, polyimide.

As an example of the TFT layer 3, a base coat layer 20, a semiconductor layer, a gate insulating layer 21, a first metal layer 22, a first inorganic insulating layer 14 (inorganic insulating layer), a second metal layer, a second inorganic insulating layer 23, a third metal layer, and a flattened layer 24 are formed in this order on the substrate.

The base coat layer 20, the gate insulating layer 21, the first inorganic insulating layer 14, and the second inorganic insulating layer 23 are inorganic insulating films made of silicon oxide, silicon nitride, silicon oxynitride, or the like.

The first metal layer 22, the second metal layer, and the third metal layer are metal layers containing Mo (including molybdenum nitride), Ti, Cu, Al, and the like. The metal layer may be a single layer of Mo or the like, or a Cu/Ti layered film in which Ti is formed under Cu, Ti/Al/Ti layered film, or the like.

The first metal layer 22 constitutes a gate electrode and a scanning signal line. The second metal layer constitutes an initialization power source line. The third metal layer constitutes a data signal line and a high-power supply voltage line. However, the above are examples, and are not intended to be limiting.

The semiconductor layer is made of amorphous silicon, polysilicon, an oxide semiconductor, or the like.

The light-emitting element layer 4 includes a first electrode, an edge cover that covers the periphery of the first electrode, a light-emitting layer, and a second electrode. The light-emitting layer is composed of an organic Electro Luminescence (EL), an inorganic EL provided with inorganic light emitting diodes, a Quantum dot Light Emitting Diode (QLED), or the like.

The sealing layer 5 is formed, for example, by providing an organic resin film between two inorganic insulating films.

A second adhesive layer (OCA) 25, a circular polarizer 26, and a third adhesive layer (OCA) 27 are formed on the function layer 7 in this order in the display region R1. A cover glass 28 is arranged on the third adhesive layer 27 over the display region R1 and the frame region R2. The cover glass 28 may be a cover made of transparent plastic such as polycarbonate or acrylic.

The first inorganic insulating layer 14 has a first slit 11 that extends in a y direction in the bending region R4 along the edge of the frame region R2. The first slit 11 is a base coat rejection (BCR) formed by removing the first inorganic insulating layer 14 which is a base coat film. A filler resin layer 13 is formed so as to fill the first slit 11. The flexible sheet 8 has a second slit 12 that extends in the y direction in the bending region R4 along the edge of the frame region R2.

The first adhesive layer 6 for bonding the function layer 7 to the sealing layer 5 is formed so as to extend from the display region R1 to the frame region R2 and overlap with the first slit 11 and the second slit 12.

Note that the second adhesive layer 25 may be formed so as to extend from the display region R1 to the frame region R2 and overlap with the first slit 11 and the second slit 12. In this case, by extending the two adhesive layers of the first adhesive layer 6 and the second adhesive layer 25 to the bending region R4, the film thickness of the adhesive layer that protects the TFT layer 3 in the bending region R4 can be increased.

As illustrated in FIG. 4, a spacer 9 having a thickness D1 is arranged between a part of the bent flexible sheet 8 on the display region R1 side with respect to the second slit 12 and another part of the flexible sheet 8 on an opposite side of the display region R1 with respect to the second slit 12.

Then, a first adhesive layer 10 (adhesive layer) having a thickness D2 that bonds the part of the flexible sheet 8 on the display region R1 side with respect to the second slit 12 to the spacer 9, and a second adhesive layer 32 having a thickness D3 that bonds the other part of the flexible sheet 8 on the opposite side of the display region R1 with respect to the second slit 12 to the spacer 9 are provided.

Method for Manufacturing Display Device 1

Figure 5:
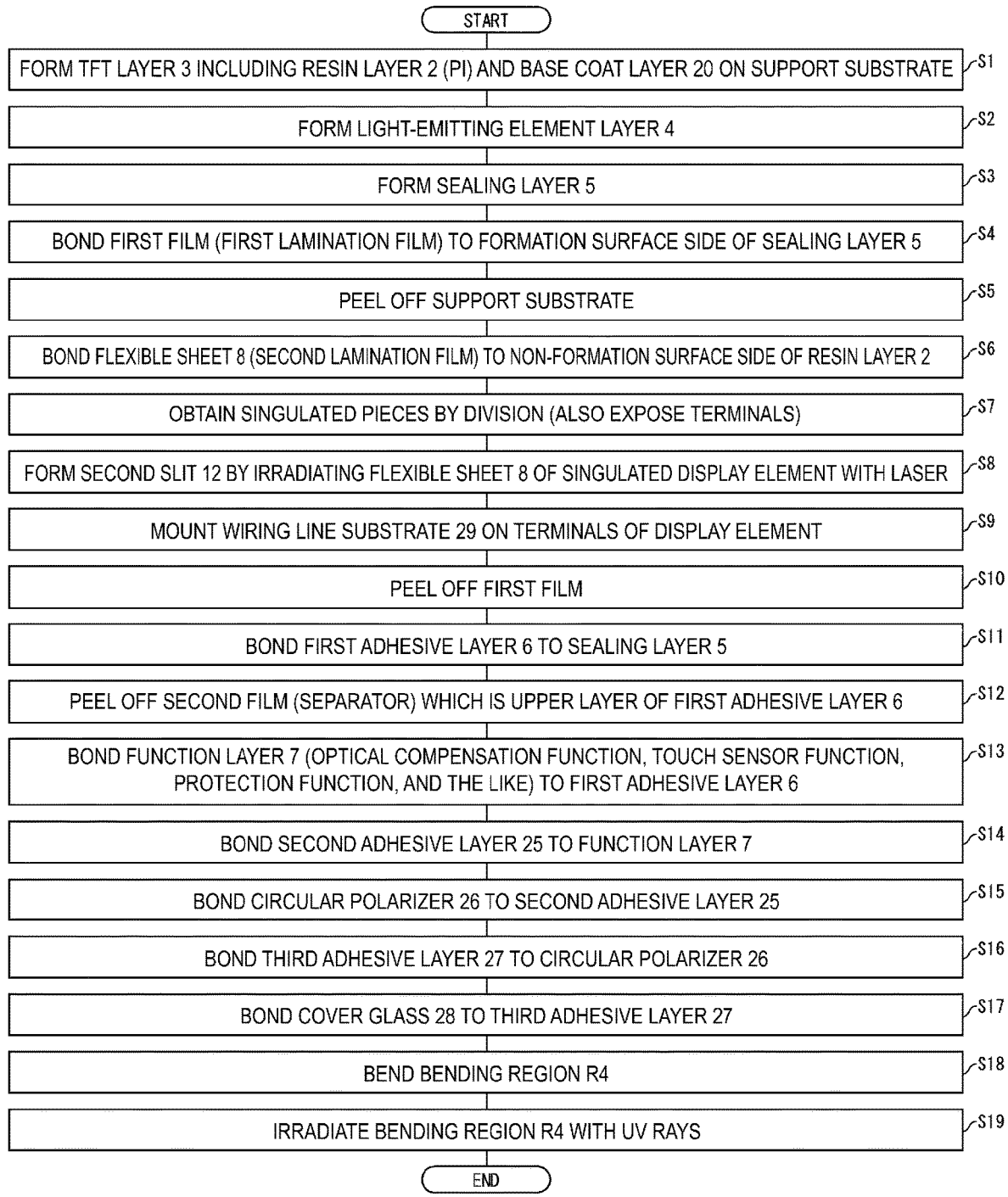
FIG. 5 is a flowchart illustrating a method for manufacturing the display device.

FIG. 5 is a flowchart illustrating a method for manufacturing the display device 1. First, the resin layer 2 and the TFT layer 3 including the base coat layer 20 are formed on a support substrate (glass substrate) (not illustrated) (step S1). Then, the light-emitting element layer 4 is formed on the TFT layer 3 (step S2). Next, the sealing layer 5 is formed on the TFT layer 3 in a state of covering the light-emitting element layer 4 (step S3).

Thereafter, a first film (first lamination film) is bonded to a formation surface side of the sealing layer 5 (step S4). Then, the support substrate is peeled off from the resin layer 2 (step S5). Next, a flexible sheet (second lamination film) 8 is bonded to a non-formation surface side of the resin layer 2 (step S6). Thereafter, by dividing along a direction perpendicular to the resin layer 2, display elements are singulated and terminals are exposed (step S7).

Then, the flexible sheet 8 of the singulated display element is irradiated with a laser to form the second slit 12 (step S8). Next, the wiring line substrate (Chip On Film (COF)) 29 is mounted in the terminal region R3 of the display element (step S9). Thereafter, the first film (first lamination film) is peeled off from the sealing layer 5 (step S10)

Then, the first adhesive layer 6 is bonded to the sealing layer 5 (step S11). Next, the second film (separator) which is an upper layer of the first adhesive layer 6 is peeled off (step S12). Thereafter, the function layer 7 is bonded to the first adhesive layer 6 (step S13). The function layer 7 has an optical compensation function, a touch sensor function, a protection function, and the like. Then, the second adhesive layer 25 is bonded to the function layer 7 (step S14).

Next, the circular polarizer 26 is bonded to the second adhesive layer 25 (step S15). Thereafter, the third adhesive layer 27 is bonded to the circular polarizer 26 (step S16). Then, the cover glass 28 is bonded to the third adhesive layer 27 (step S17).

Next, the bending region R4 of the frame region R2 is bent into a substantially J shape as illustrated in FIG. 4 (step S18). Thereafter, the first adhesive layer 6 in the bending region R4 is irradiated with ultraviolet rays (UV) 19 along directions illustrated in FIG. 4 to cure the first adhesive layer 6 and maintain the bent shape (step S19). A region of the first adhesive layer 6 covered with the cover glass 28 is not cured because the irradiated ultraviolet rays 19 do not reach the region.

Modified Example

Figure 6:
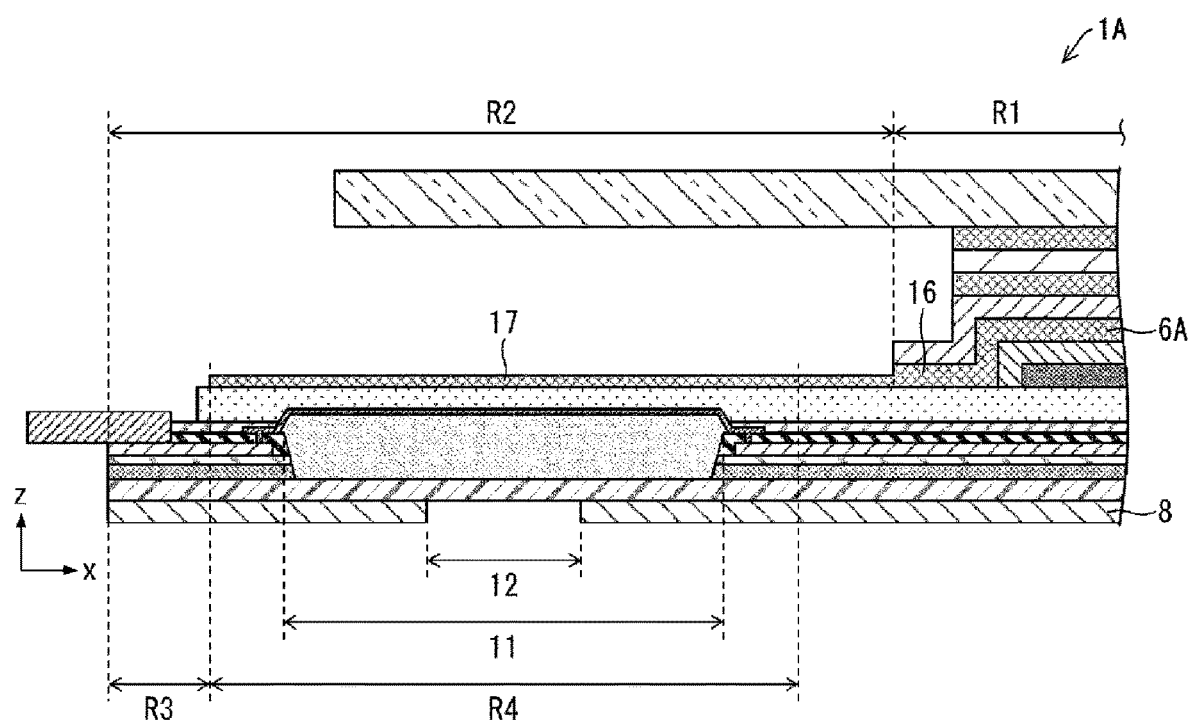
FIG. 6 is a cross-sectional view of the display device according to a modified example before bending.
Figure 7:
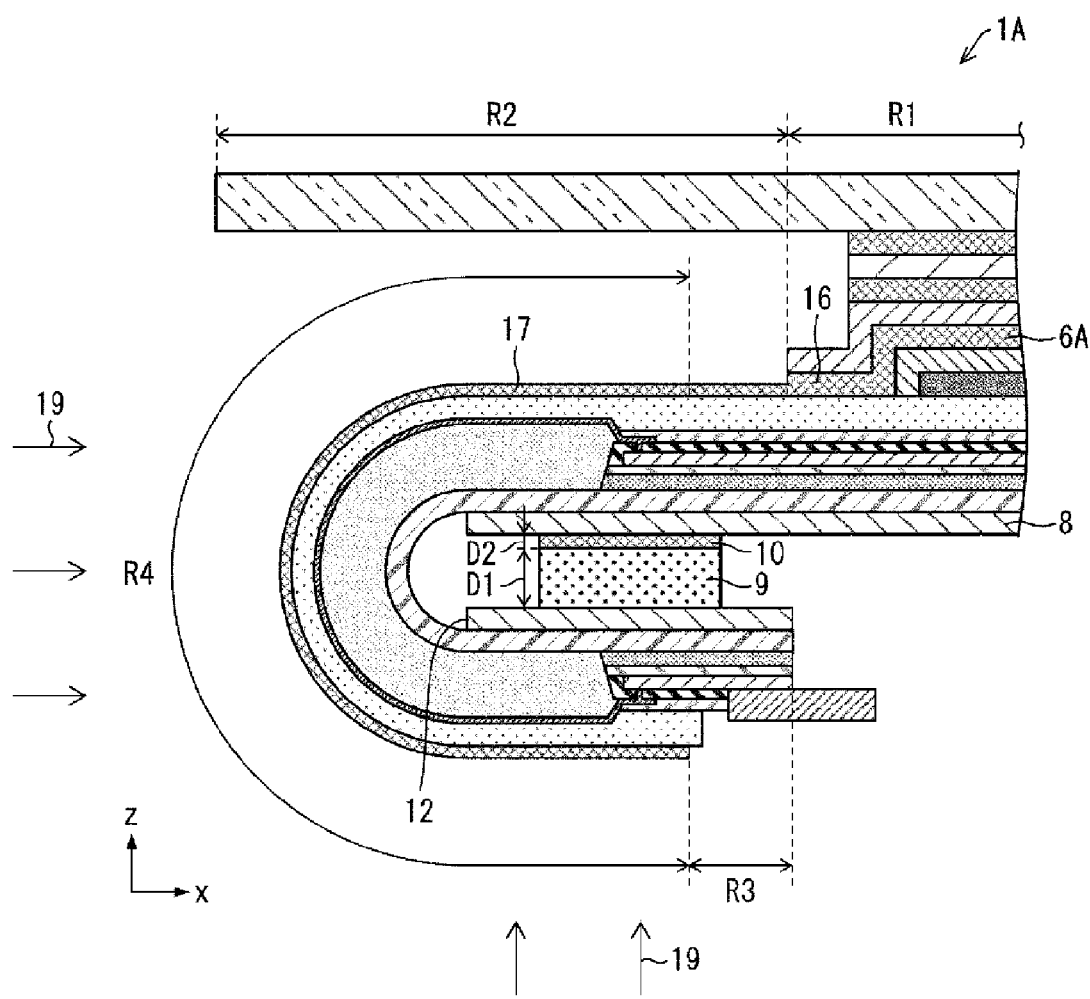
FIG. 7 is a cross-sectional view of the display device according to the modified example after bending.

FIG. 6 is a cross-sectional view of a modified example of a display device before bending, and FIG. 7 is a cross-sectional view after bending thereof. Constituent elements similar to the constituent elements described above are given the same reference numerals, and detailed descriptions thereof are not repeated.

A first adhesive layer 6A of a display device 1A has a thick film adhesive portion 16 arranged in the display region R1, and a thin film adhesive portion 17 that is arranged in the frame region R2 and thinner than the thick film adhesive portion 16. With this configuration, the first adhesive layer 6A in the bending region R4 becomes thin, so that the display device 1A can be easily bent in the bending region R4.

Further, for the adhesive for bonding the spacer 9 to the flexible sheet 8, only the first adhesive layer 10 may be used, and the second adhesive layer 32 described above in FIG. 4 can be removed to adopt a single-sided adhesive design. As a result, the distance between the flexible sheets 8 after bending is reduced from the (thickness D1 of the spacer 9)+(thickness D2 of the first adhesive layer 10)+(thickness D3 of the second adhesive layer 32) illustrated in FIG. 4 to the (thickness D1 of the spacer 9)+(thickness D2 of the first adhesive layer 10). Subsequently, the display device can be made thinner.

Figure 8:
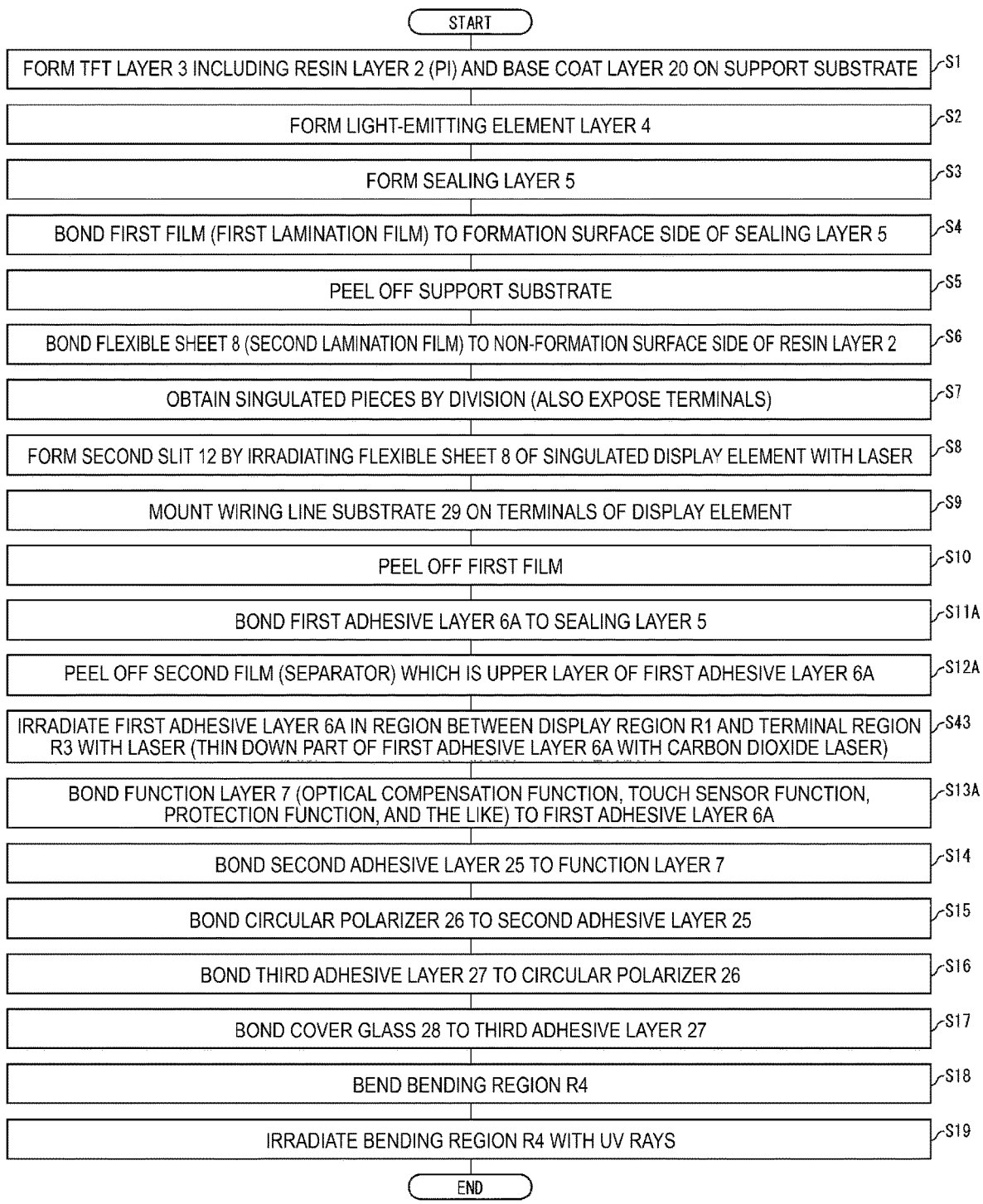
FIG. 8 is a flowchart illustrating a method for manufacturing the display device according to the modified example.

FIG. 8 is a flowchart illustrating a method for manufacturing the display device according to the modified example. Constituent elements similar to the constituent elements described above are given the same reference numerals, and detailed descriptions thereof are not repeated.

Steps S1 to S10 illustrated in FIG. 8 are the same as steps S1 to S10 described with reference to FIG. 5. Next, the first adhesive layer 6A is bonded to the sealing layer 5 (step S11A). Thereafter, a second film (separator) which is an upper layer of the first adhesive layer 6A is peeled off (step S12A). Then, the first adhesive layer 6A in a region between the display region R1 and the terminal region R3 is irradiated with a carbon dioxide gas laser to form the thin film adhesive portion 17 (step S43). Next, the function layer 7 is bonded to the first adhesive layer 6A (step S13A). Steps S14 to S19 are the same as steps S14 to S19 described with reference to FIG. 5.

Figure 9:
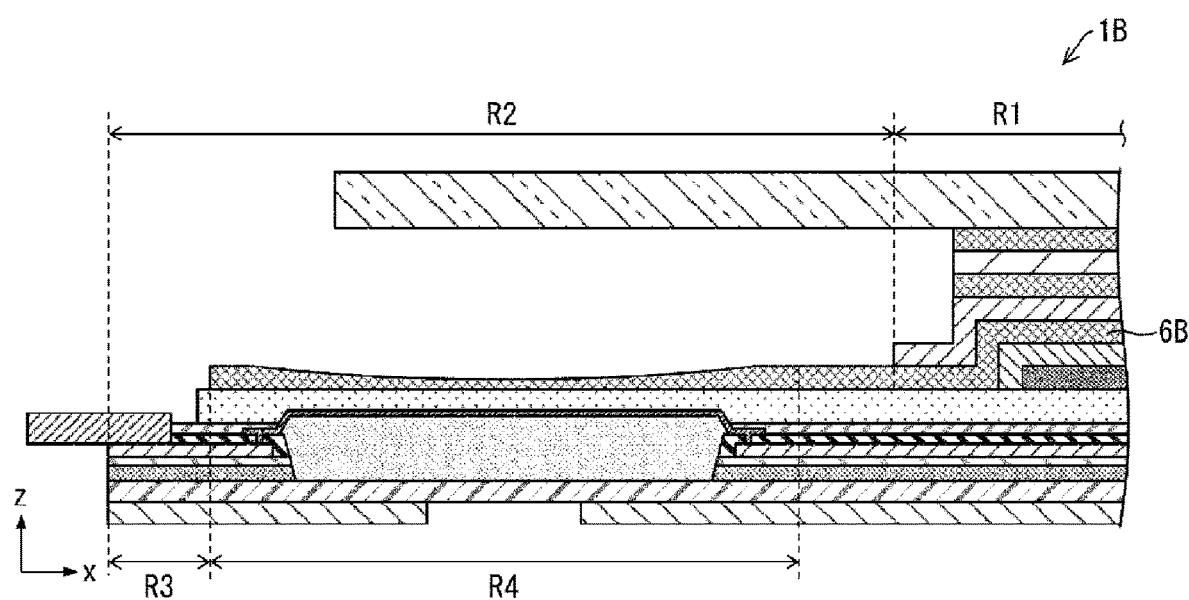
FIG. 9 is a cross-sectional view of the display device according to another modified example.

FIG. 9 is a cross-sectional view of a display device according to another modified example. Constituent elements similar to the constituent elements described above are given the same reference numerals, and detailed descriptions thereof are not repeated.

As illustrated in FIG. 9, in the bending region R4, it is preferable that a first adhesive layer 6B be formed in a state of becoming thinner toward the center of the bending region R4. With this configuration, the first adhesive layer 6B in the bending region R4 becomes thin, so that a display device 1B can be easily bent in the bending region R4.

Second Embodiment

Figure 10:
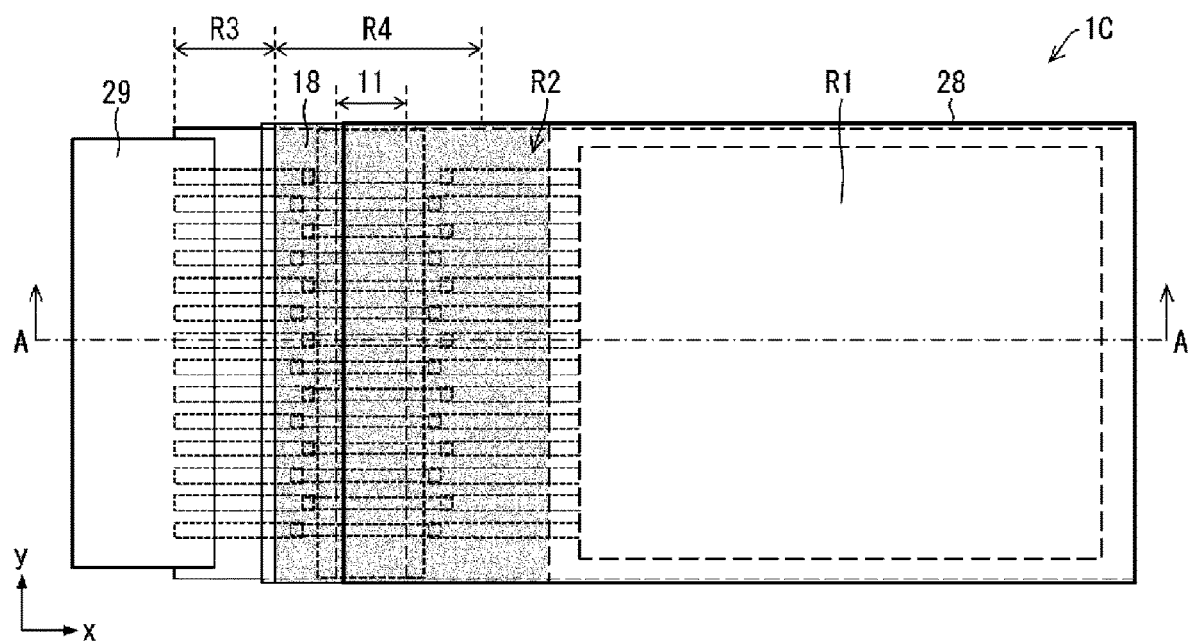
FIG. 10 is a plan view of a display device according to a second embodiment before bending.
Figure 11:
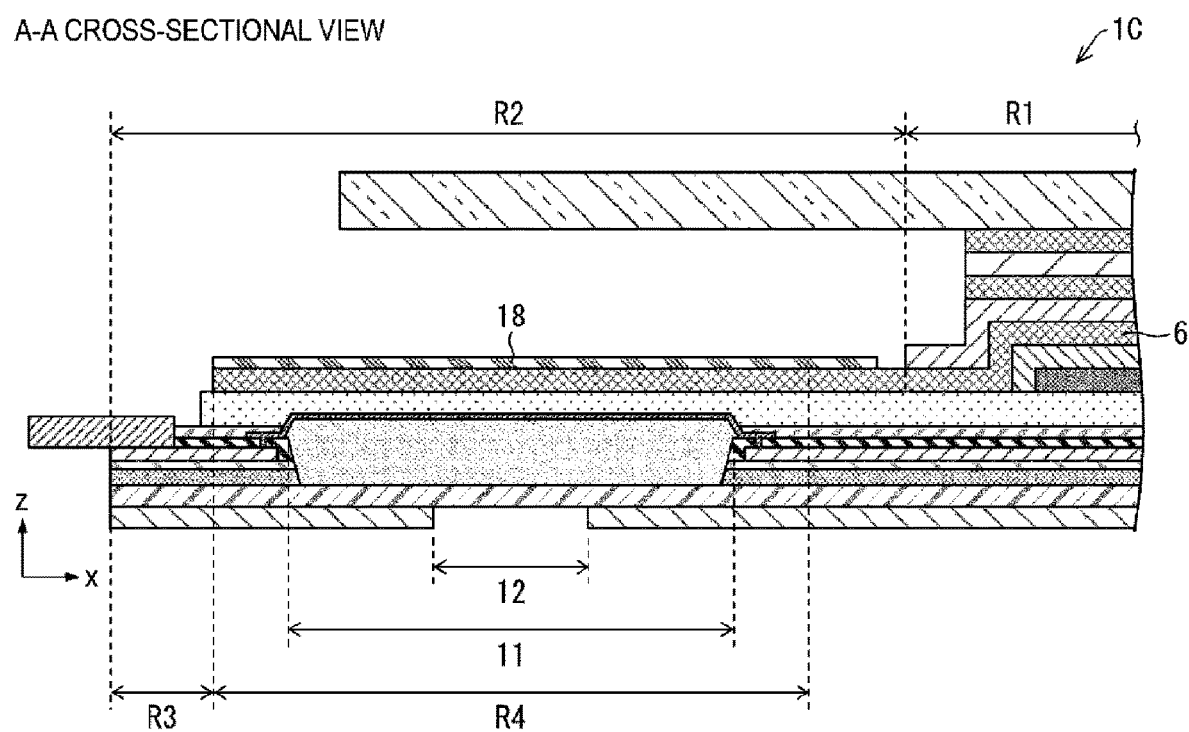
FIG. 11 is a cross-sectional view of the display device before bending.
Figure 12:
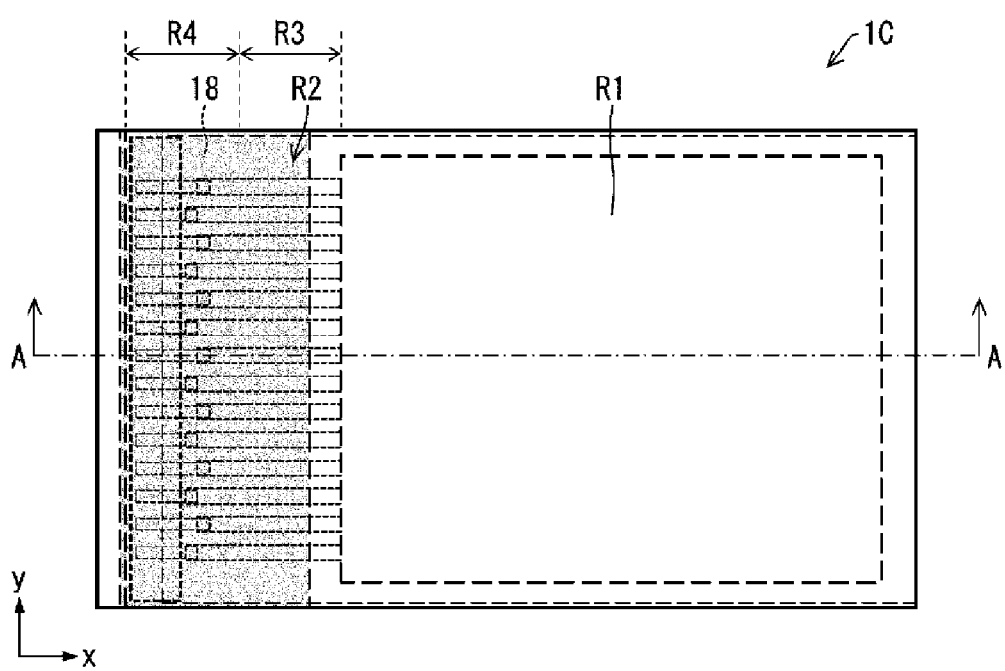
FIG. 12 is a plan view of the display device after bending.
Figure 13:
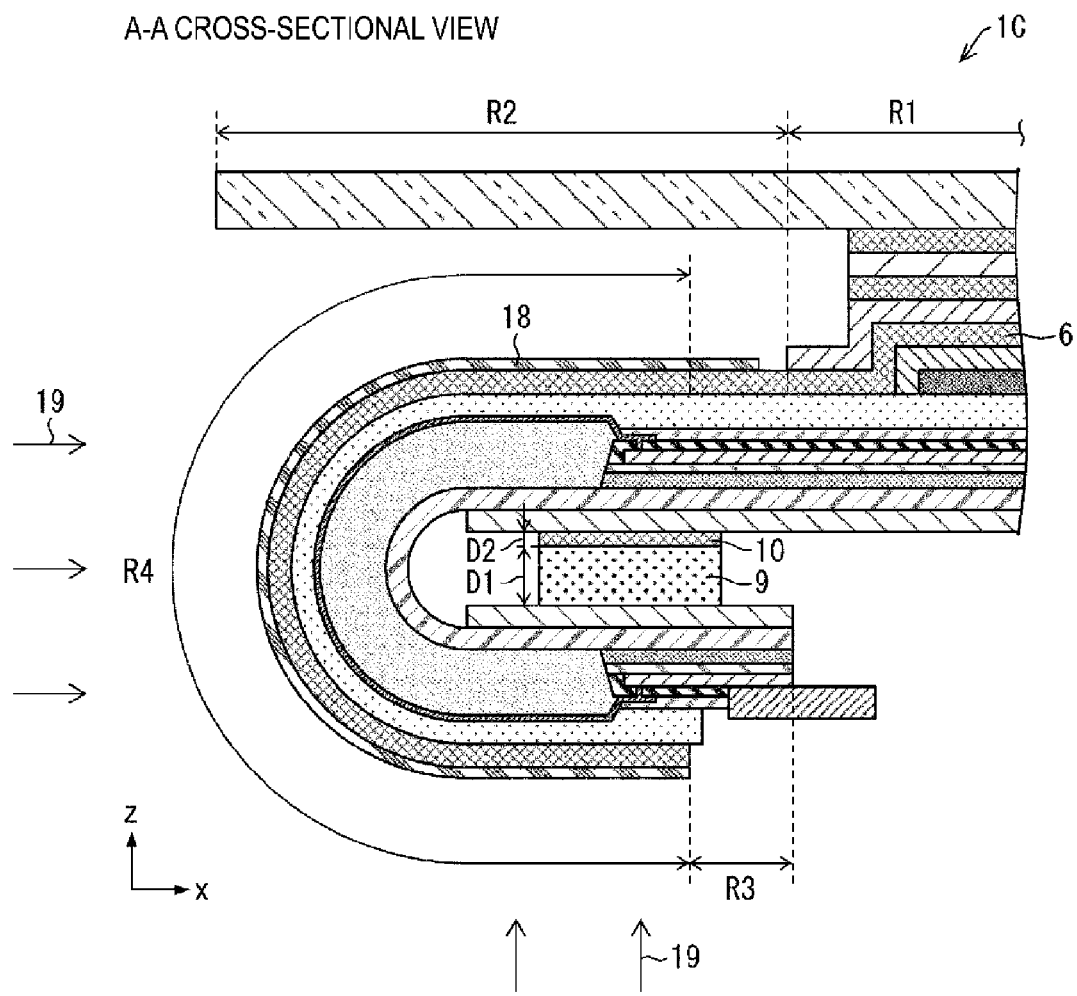
FIG. 13 is a cross-sectional view of the display device after bending.

FIG. 10 is a plan view of a display device 1C according to a second embodiment before bending, and FIG. 11 is a cross-sectional view thereof. FIG. 12 is a plan view of the display device 1C after bending, and FIG. 13 is a cross-sectional view thereof. Constituent elements similar to the constituent elements described above are given the same reference numerals, and detailed descriptions thereof are not repeated.

A separator 18 is formed on the first adhesive layer 6 in the frame region R2 so as to overlap with the first slit 11 and the second slit 12.

Figure 14:
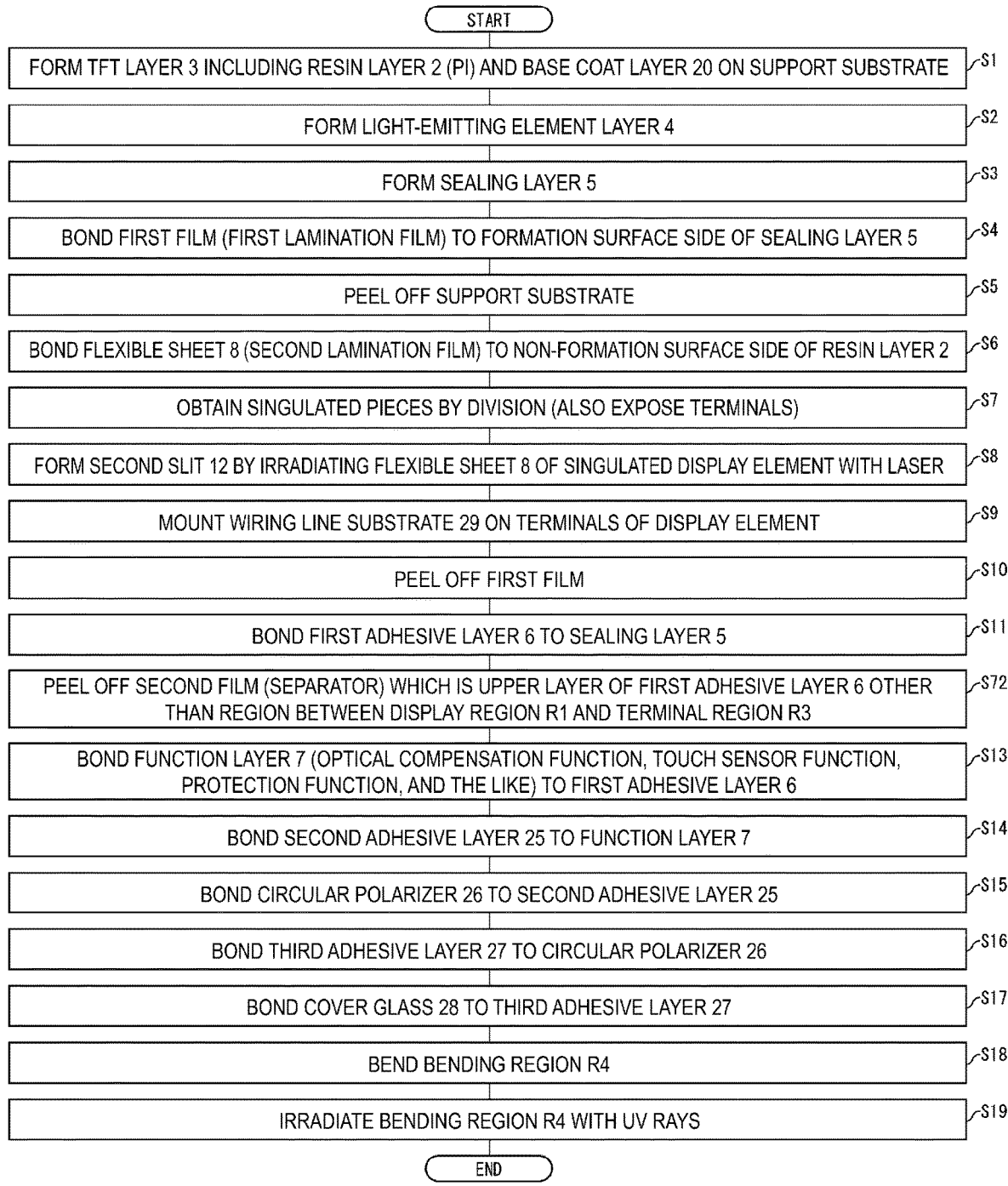
FIG. 14 is a flowchart illustrating a method for manufacturing the display device.

FIG. 14 is a flowchart illustrating a method for manufacturing the display device 1C. Constituent elements similar to the constituent elements described above are given the same reference numerals, and detailed descriptions thereof are not repeated.

Steps S1 to S11 illustrated in FIG. 14 are the same as steps S1 to S11 described with reference to FIG. 5. The first adhesive layer 6 has the separator (second film) 18 formed as an upper layer thereof. Then, the separator 18 which is the upper layer of the first adhesive layer 6 is peeled off in a region other than the region between the display region R1 and the terminal region R3 (step S72). As a result, the separator 18 in the region between the display region R1 and the terminal region R3 remains. Steps S13 to S19 are the same as steps S13 to S19 described with reference to FIG. 5.

Note that the first adhesive layer 6 in the bending region R4 is irradiated with ultraviolet rays 19 (UV) through the separator 18 to cure the first adhesive layer 6.

Comparative Example

Figure 15:
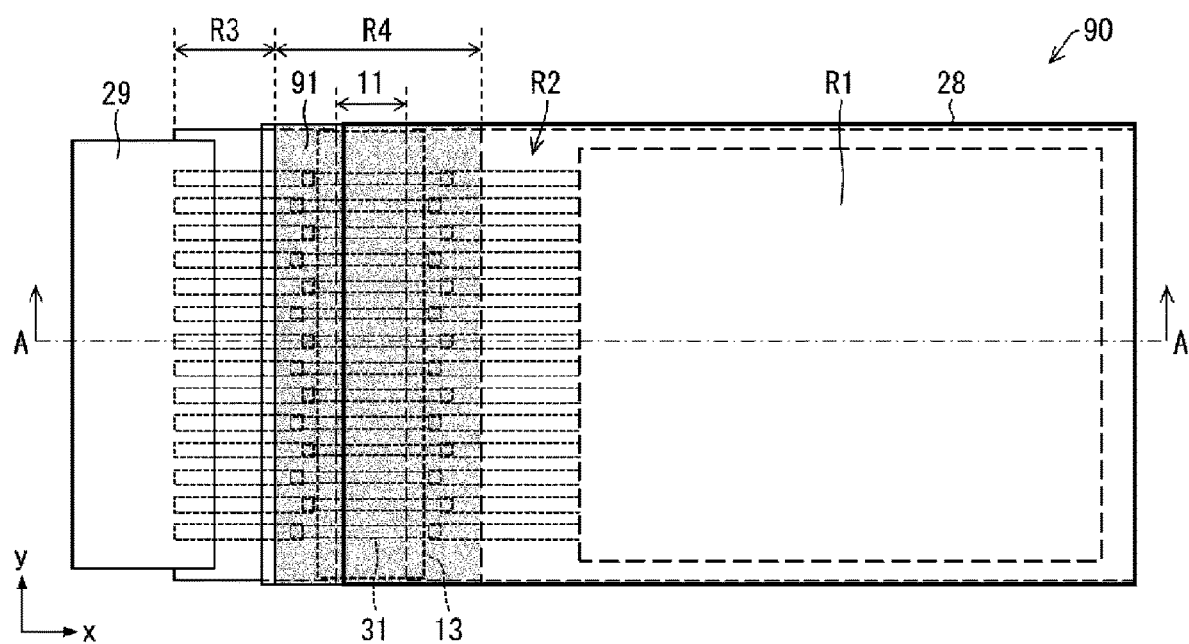
FIG. 15 is a plan view of a display device according to a Comparative Example before bending.
Figure 16:
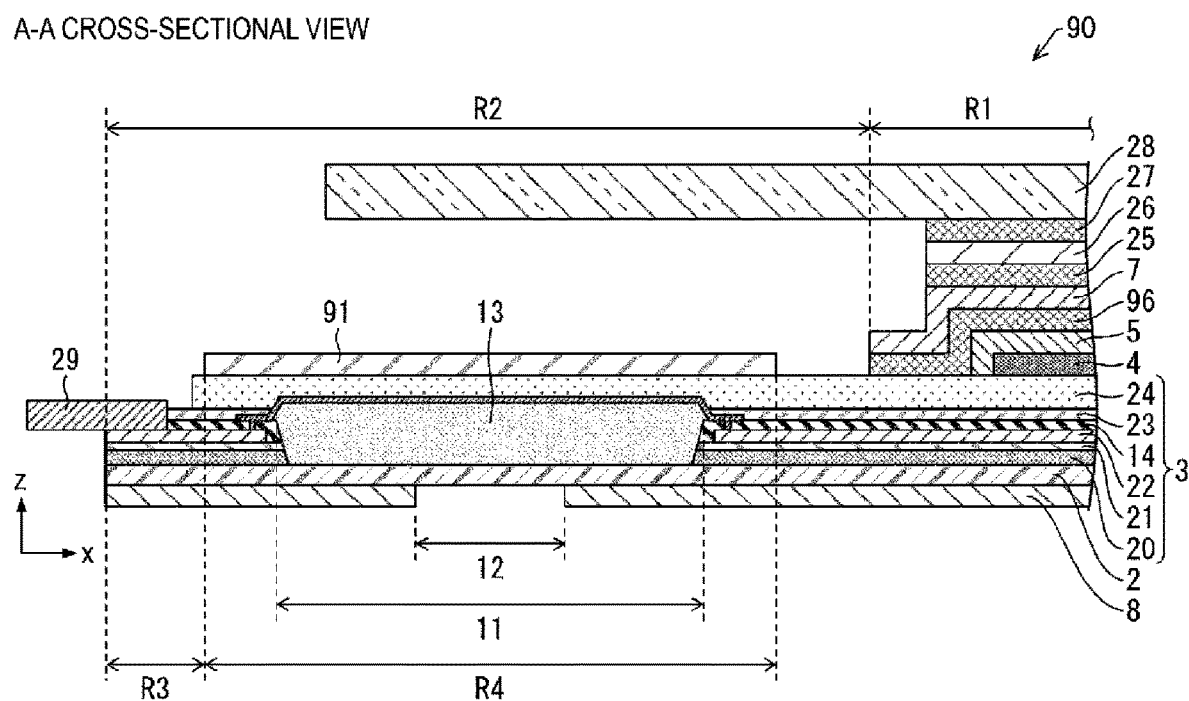
FIG. 16 is a cross-sectional view of the display device before bending.
Figure 17:
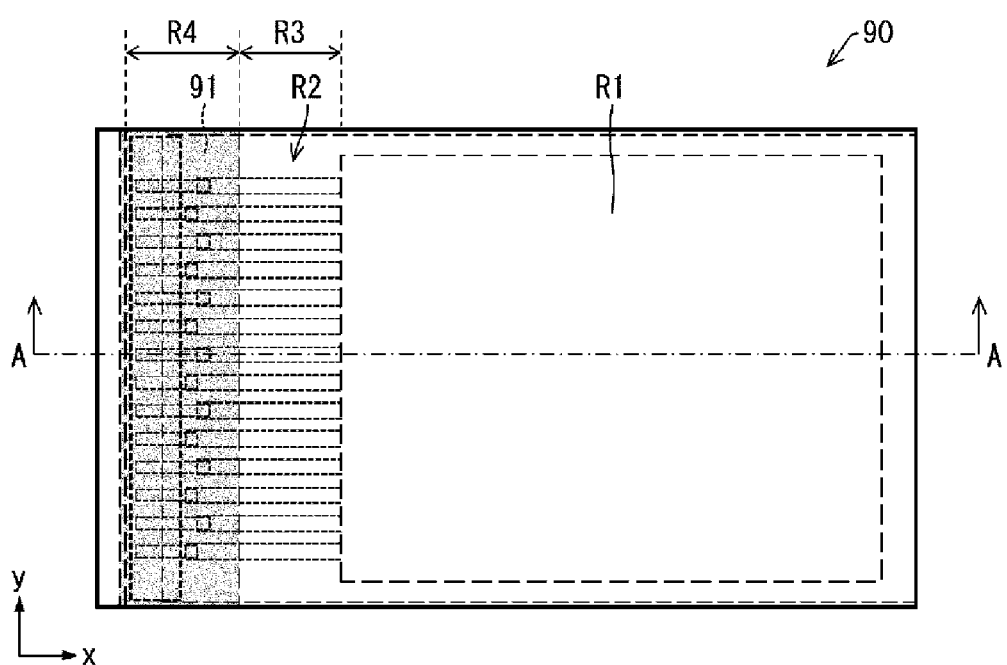
FIG. 17 is a plan view of the display device after bending.
Figure 18:
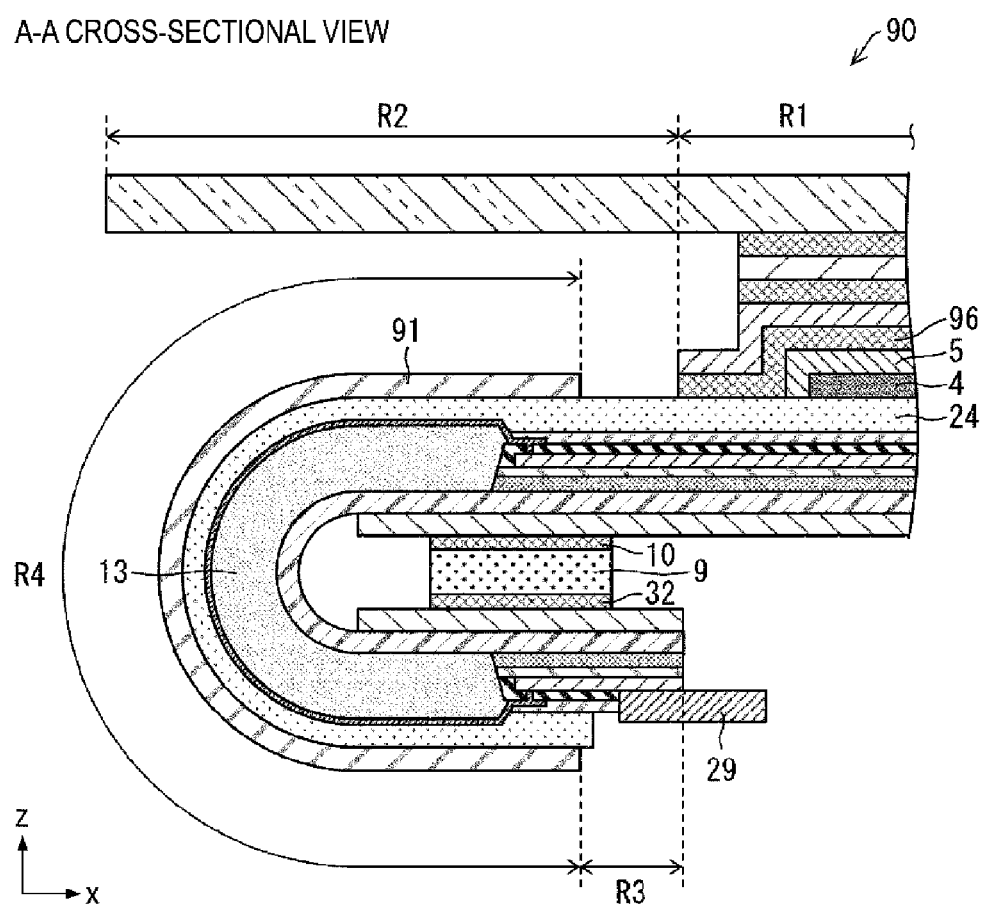
FIG. 18 is a cross-sectional view of the display device after bending.

FIG. 15 is a plan view of a display device 90 according to a Comparative Example before bending, and FIG. 16 is a cross-sectional view thereof. FIG. 17 is a plan view of the display device 90 after bending, and FIG. 18 is a cross-sectional view thereof. Constituent elements similar to the constituent elements described above are given the same reference numerals, and detailed descriptions thereof are not repeated.

A first adhesive layer 96 is formed on the flattened layer 24 of the TFT layer 3 in the display region R1 so as to cover the sealing layer 5. Then, in the bending region R4, a resin film 91 for protecting the flattened layer 24 in the bending region R4 is formed on the flattened layer 24. This resin film 91 needs to be formed by an additional step different from the step of forming the first adhesive layer 96 and the like. Therefore, there arises a problem that the man-hours and the number of components increase.

In contrast, according to the first and second embodiments, the first adhesive layers 6, 6A, and 6B are extended from the display region R1 to the frame region R2 so as to overlap with the first slit 11 and the second slit 12. Therefore, the first adhesive layers 6, 6A, and 6B extend from the display region R1 so as to cover the region of the resin film 91 according to the Comparative Example. Thus, only the step of forming the first adhesive layer 6 and the like is required, and there is no need to add the separate step for forming the resin film 91. As a result, the display devices 1, 1A, and 1B can be bent to form a narrow frame region by a simple configuration and a simple process.

Supplement

A display device according to an aspect 1 has a display region configured to display an image and a frame region surrounding the display region, in which the frame region includes a terminal region arranged at an edge of the frame region and a bending region bent between the display region and the terminal region. The display device includes a substrate arranged in the display region and the frame region, a TFT layer formed on the substrate, a light-emitting element layer formed on the TFT layer in the display region, a sealing layer formed in the display region in a state of covering the light-emitting element layer, an adhesive layer formed on the sealing layer in the display region, a function layer formed on the adhesive layer in the display region, and a flexible sheet formed on the substrate on an opposite side of the TFT layer, in which the TFT layer includes at least one inorganic insulating film, the inorganic insulating film has a first slit extending in the bending region along the edge of the frame region, the flexible sheet has a second slit extending in the bending region along the edge of the frame region. The display device further includes a filler resin layer that fills the first slit, in which the adhesive layer overlaps with the first slit and the second slit by extending from the display region to the frame region.

The display device according to a second aspect further includes a spacer arranged between a part of the flexible sheet on a display region side with respect to the second slit and another part of the flexible sheet on an opposite side of the display region with respect to the second slit, and an adhesive layer that bonds one of the part of the flexible sheet on the display region side with respect to the second slit and the other part of the flexible sheet on the opposite side of the display region with respect to the second slit to the spacer.

In the display device according to a third aspect, the adhesive layer bonds the part of the flexible sheet on the display region side with respect to the second slit to the spacer.

The display device according to a fourth aspect further includes a separator formed on the adhesive layer in the frame region in a state of overlapping with the first slit and the second slit.

In the display device according to a fifth aspect, the adhesive layer includes an uncured adhesive portion arranged in the display region and a cured adhesive portion arranged in the frame region and harder than the uncured adhesive portion.

In the display device according to a sixth aspect, the adhesive layer includes a thick film adhesive portion arranged in the display region and a thin film adhesive portion arranged in the frame region and thinner than the thick film adhesive portion.

In the display device according to a seventh aspect, the adhesive layer is formed in a state of becoming thinner toward the center of the bending region.

In a method for manufacturing a display device according to an eighth aspect, the display device has a display region configured to display an image and a frame region surrounding the display region, in which the frame region includes a terminal region arranged at an edge of the frame region and a bending region bent between the display region and the terminal region. The method includes forming a TFT layer on a substrate arranged in the display region and the frame region, forming a light-emitting element layer on the TFT layer in the display region, forming a sealing layer in the display region in a state of covering the light-emitting element layer, bonding a first film to the sealing layer, peeling off the substrate from the TFT layer, bonding a flexible sheet to the TFT layer on an opposite side of the light-emitting element layer, peeling off the first film on the sealing layer, bonding a second film in which an adhesive layer and a separator are layered on the sealing layer formed in the display region and the TFT layer formed in the display region and the frame region, peeling off the separator overlapping with at least the display region from the adhesive layer, bonding a function layer to the display region via the adhesive layer, bending the flexible sheet, the TFT layer, and the adhesive layer between the display region and the terminal region in the bending region, and curing the adhesive layer by irradiating the adhesive layer in the bending region with ultraviolet rays.

The method for manufacturing the display device according to a ninth aspect further includes bonding a spacer to a part of the flexible sheet on a display region side by an adhesive layer before the bending.

In the method for manufacturing the display device according to a 10th aspect, in which in the bending, the spacer comes into contact with another part of the flexible sheet on an opposite side of the display region side without using an adhesive.

In the method for manufacturing the display device according to an 11th aspect, in the peeling off the separator, the separator overlapping with the bending region remains on the adhesive layer.

In the method for manufacturing the display device according to a 12th aspect, in the forming the TFT layer, the TFT layer includes at least one inorganic insulating film, and a first slit extending along an edge of the frame region is formed in the inorganic insulating film. The method further includes irradiating a surface of the adhesive layer that overlaps with the first slit with a laser between the peeling off the separator and the bending in order to make a thickness of the adhesive layer that overlaps with the first slit thinner than a thickness of the adhesive layer that overlaps with the display region.

In the method for manufacturing the display device according to a 13th aspect, in the irradiating the surface, by irradiating the surface of the adhesive layer with the laser, the adhesive layer is formed in a state of becoming thinner toward the center of the bending region in the bending region.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device having a display region configured to display an image and a frame region surrounding the display region, in which the frame region includes a terminal region arranged at an edge of the frame region and a bending region bent between the display region and the terminal region, the display device comprising:
   a resin layer arranged in the display region and the frame region;
   a TFT layer formed on the resin layer;
   a light-emitting element layer formed on the TFT layer in the display region;
   a sealing layer formed in the display region covering the light-emitting element layer;
   an adhesive layer formed on the sealing layer in the display region;
   a function layer formed on the adhesive layer in the display region; and
   a flexible sheet formed on the resin layer on an opposite side of the TFT layer, wherein the TFT layer includes at least one inorganic insulating film, the inorganic insulating film includes a first slit extending in the bending region along the edge of the frame region, the flexible sheet includes a second slit extending in the bending region along the edge of the frame region,
   the display device further comprising a filler resin layer that fills the first slit, wherein the adhesive layer overlaps the first slit and the second slit by extending from the display region to the frame region.

2. The display device according to claim 1 further comprising: a spacer arranged between a part of the flexible sheet on a display region side with respect to the second slit and another part of the flexible sheet on an opposite side of the display region with respect to the second slit: and an adhesive layer that bonds one of the part of the flexible sheet on the display region side with respect to the second slit and another part of the flexible sheet on the opposite side of the display region with respect to the second slit to the spacer.

3. The display device according to claim 2, wherein the adhesive layer bonds the part of the flexible sheet on the display region side with respect to the second slit to the spacer.

4. The display device according to claim 1, further comprising a separator formed on the adhesive layer in the frame region in a state of overlapping the first slit and the second slit.

5. The display device according to claim 1, wherein the adhesive layer includes an uncured adhesive portion arranged in the display region and a cured adhesive portion arranged in the frame region and harder than the uncured adhesive portion.

6. The display device according to claim 1, wherein the adhesive layer includes a thick film adhesive portion arranged in the display region and a thin film adhesive portion arranged in the frame region and thinner than the thick film adhesive portion.

7. The display device according to claim 1, wherein the adhesive layer is formed to become thinner toward the center of the bending region.

* * * * *